United States Patent
Dickey et al.

(10) Patent No.: US 10,177,757 B2
(45) Date of Patent: Jan. 8, 2019

(54) SINGLE EVENT LATCHUP MITIGATION WITH SAMPLE AND HOLD

(71) Applicant: Hamilton Sundstrand Corporation, Charlotte, NC (US)

(72) Inventors: John A. Dickey, Caledonia, IL (US); Joshua C. Swenson, Rockford, IL (US)

(73) Assignee: HAMILTON SUNDSTRAND CORPORATION-PCSS, Charlotte, NC (US)

( * ) Notice: Subject to any disclaimer, the term of this patent is extended or adjusted under 35 U.S.C. 154(b) by 0 days.

(21) Appl. No.: 15/371,906

(22) Filed: Dec. 7, 2016

(65) Prior Publication Data

US 2018/0159524 A1    Jun. 7, 2018

(51) Int. Cl.
| | |
|---|---|
| H03B 1/00 | (2006.01) |
| H03K 3/00 | (2006.01) |
| H03K 17/16 | (2006.01) |
| H03K 3/013 | (2006.01) |
| H03K 17/0812 | (2006.01) |
| H03K 17/24 | (2006.01) |

(52) U.S. Cl.
CPC ........... *H03K 17/161* (2013.01); *H03K 3/013* (2013.01); *H03K 17/08122* (2013.01); *H03K 17/24* (2013.01)

(58) Field of Classification Search
CPC ........... H03K 3/00; H03K 3/01; H03K 3/012; H03K 17/16; H03K 17/161–17/167
USPC .................................................. 327/108–112
See application file for complete search history.

(56) References Cited

U.S. PATENT DOCUMENTS

| | | | |
|---|---|---|---|
| 4,740,883 A | 4/1988 | McCollum | |
| 5,752,047 A | 5/1998 | Darty et al. | |
| 7,075,355 B2 * | 7/2006 | Furuie | H03K 17/168 327/108 |
| 7,157,889 B2 | 1/2007 | Kernahan et al. | |
| 7,463,469 B2 | 12/2008 | Jacobs | |
| 7,688,558 B2 | 3/2010 | Bax et al. | |
| 7,706,116 B2 | 4/2010 | Liu et al. | |
| 8,053,997 B2 | 11/2011 | Salvestrini | |

(Continued)

FOREIGN PATENT DOCUMENTS

| | | |
|---|---|---|
| CN | 103916112 A | 7/2014 |
| CN | 104102263 B | 11/2015 |

(Continued)

OTHER PUBLICATIONS

European Search Report for Application No. 17205747.3-1203 dated Apr. 11, 2018, 11 pages.

(Continued)

*Primary Examiner* — Lincoln D Donovan
*Assistant Examiner* — Diana J. Cheng
(74) *Attorney, Agent, or Firm* — Cantor Colburn LLP

(57) ABSTRACT

A system for mitigating a solid state power controller (SSPC) open or closed state change caused by single event latchup (SEL) includes an ON circuit, an OFF circuit operatively connected in parallel to the ON circuit, a holding capacitor operatively connected in parallel with the ON circuit and the OFF circuit, and a power switching device operatively connected to the holding capacitor and the ON circuit. The system is configured to maintain, during and after the SEL, a drive state voltage to the power switching device that is stored in the holding capacitor prior to the SEL.

16 Claims, 2 Drawing Sheets

(56) References Cited

U.S. PATENT DOCUMENTS

| | | |
|---|---|---|
| 8,059,378 B2 | 11/2011 | Liu et al. |
| 8,525,581 B2 | 9/2013 | Rountree |
| 8,791,673 B2 | 7/2014 | Hattori et al. |
| 9,626,890 B2 * | 4/2017 | Lin .......................... G09G 3/20 |
| 2006/0044723 A1 | 3/2006 | Beneditz |
| 2013/0155733 A1 | 6/2013 | Mayell |
| 2016/0285353 A1 * | 9/2016 | Kim .................... H02M 1/4208 |

FOREIGN PATENT DOCUMENTS

| | | |
|---|---|---|
| EP | 0468650 A1 | 1/1992 |
| EP | 667303 A2 | 6/2006 |

OTHER PUBLICATIONS

Wang, W. "RC hardened FPGA configuration SRAM cell design" Electronics Let, IEE Stevenage, GB, vol. 40, No. 9, Apr. 20, 2004, pp. 525-526.

* cited by examiner

SINGLE EVENT LATCHUP MITIGATION WITH SAMPLE AND HOLD

BACKGROUND

Exemplary embodiments pertain to the art of solid state power controllers, and more specifically, mitigating single event latchup with a sample and hold circuit.

Cosmic radiation can induce Single Event Latchup (SEL) in complex electronic devices. SELs are induced by causing conduction from the circuit to the substrate that results in a 4 layer device or SCR turning on and carrying common mode current from multiple paths through the substrate to ground. This 'latch' results in collapsing the local power supply around the fault and disrupting the ability of the circuit to function at all. The amount of circuitry affect depends on the location of the collapse and the power supply characteristics. In aerospace this may be a particular problem due to higher radiation intensities and system criticality. Certain flight paths have increasing probability of SEL due to global magnetic variances and/or atmospheric conditions. Further, SEL may become more likely at certain polar orientations where cosmic radiation intensity is higher.

Solid state power controllers (SSPCs) may switch power on and off to electrical loads (e.g., displays, components, etc.). The SSPCs may be controlled by Peripheral Interface Controllers (PICs) that monitor voltage and current status, and drive field effect transistor gates to turn the power on and off in the load circuits. SEL affecting the PICs may cause loss of control and protection of the SSPC and the SSPC output to shift from their proper state to an erroneous state.

BRIEF DESCRIPTION

Disclosed is a system for mitigating a solid state power controller (SSPC) erroneous state caused by single event latchup (SEL). The system includes an ON circuit, an OFF circuit operatively connected in parallel to the ON circuit, a holding capacitor operatively connected in parallel with the ON circuit and the OFF circuit, and a power switching device operatively connected to the holding capacitor and the ON circuit. The system is configured to maintain, during and after the SEL, a drive state voltage to the gate of the power switching device that is stored in the holding capacitor prior to the SEL.

Also disclosed is a method for mitigating a solid state power controller (SSPC) erroneous state caused by single event latchup (SEL). The method includes configuring an ON circuit, configuring an OFF circuit operatively connected in parallel to the ON circuit, configuring a holding capacitor operatively connected in parallel with the ON circuit and the OFF circuit, configuring a power switching device operatively connected to the holding capacitor and the ON circuit, and maintaining, after the SEL, a drive state voltage to the gate of the power switching device that is stored in the holding capacitor prior to the SEL.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Figure 1:
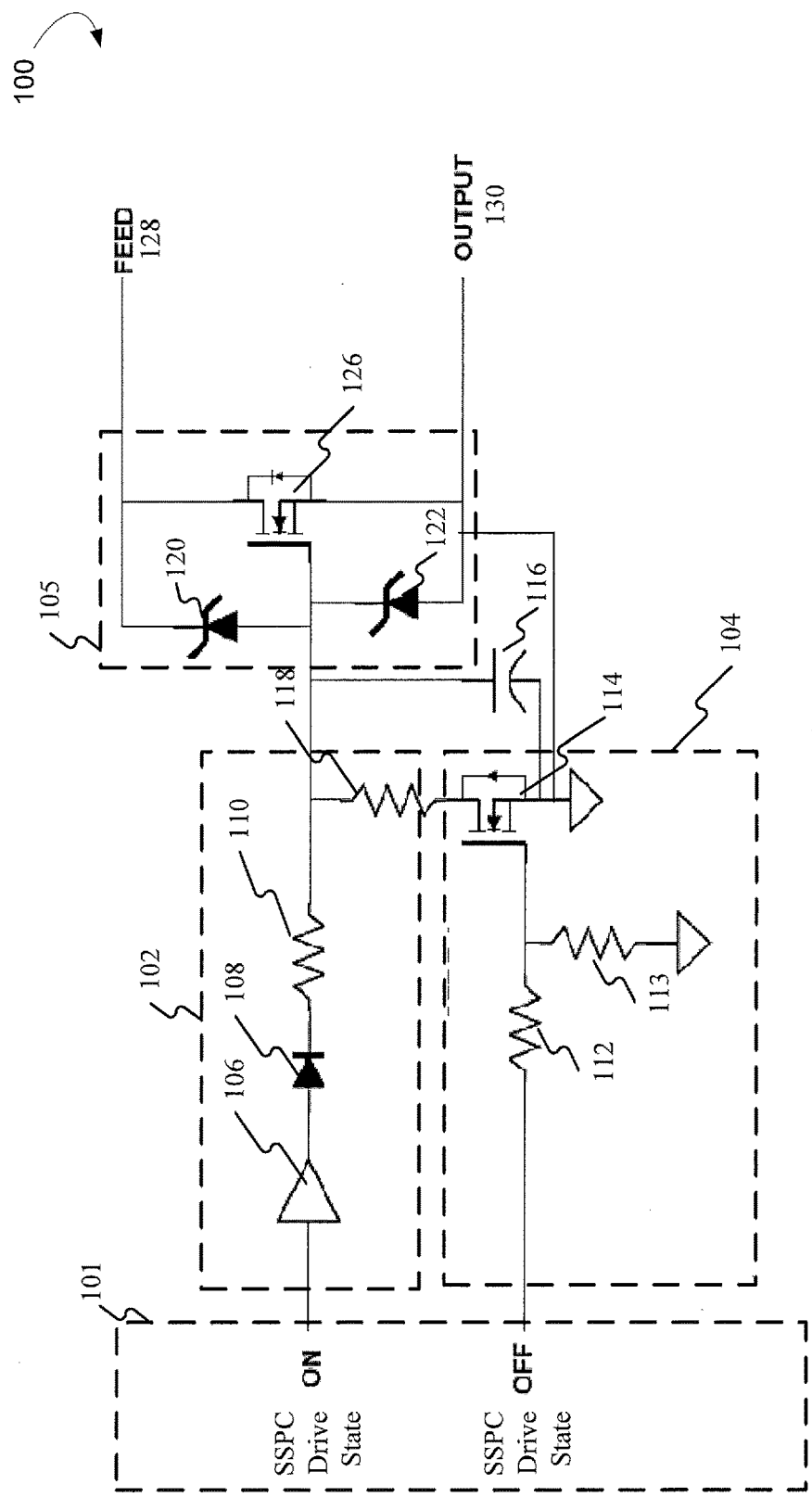
FIG. 1 depicts a system for mitigating SEL latchup conditions, according to one or more embodiments.

FIG. 1 depicts a system 100 for mitigating SEL latchup conditions, according to one or more embodiments. When an SEL affects the control logic of the SSPC, the logic power is overloaded and the signals in the circuit go to relatively low voltages. With this situation none of the outputs can be driven to the normal full logic 1 state. According to one or more embodiments, system 100 makes use of this affect by configuring the driver circuit with 2 separate sections: an ON circuit 102 and an OFF circuit 104. In some aspects, both of ON circuit 102 and OFF circuit 104 require full logic 1 states from the control logic in order to function. In addition, a holding capacitor 116 may be configured in parallel to ON circuit 102 and OFF circuit to supply drive state voltage to a power switching device 105 during any time when neither the ON nor OFF circuits are properly activated. The drive state voltage is supplied to the power switching device 105 for a predetermined time during which the SSPC control logic is reset by power cycling its operative circuits. A predetermined time may be, for example, 200 ms. The drive state voltage may be low (e.g., approximately 0 V indicating a logic value of 0) or high (a non-zero voltage indicating a logic value of 1).

According to one or more embodiments, system 100 further includes an power switching device 105 operatively connected to ON circuit 102 and OFF circuit 104 and configured to receive a drive state from the circuits. Power switching device 105 may further include a field effect transistor (FET) 126 configured in parallel with feed 128 and the output load 130. In some aspects, FET 126 may be another type of semiconductor device. In some aspects, FET 126 may include a plurality of paralleled devices. In some aspects, FET 126 may include devices in series arranged to provide bi-directional or alternating current control connection between feed 128 and load 130. In one or more embodiments, power switching device 105 may further include Zener diodes 120 and 122 configured to output FET 126 gate protection during transient events. In some embodiments, power switching device 105 may not include Zener diodes 120 and 122.

ON circuit 102 includes an amplifier configured to receive an "on" or high signal from the SSPC controller 101. ON circuit 102 further includes an amplifier 106 configured in series with a diode 108 and one or more resistive elements 110 and 118. According to one or more embodiments, when the SSPC drive state is high (i.e., on) system 100 is configured to stay on when activated through diode 108, resistive elements 110 and 118, and holding capacitor 116. If the on state droops or goes to 0 throughout the SEL or the recovering process, then holding capacitor 116 maintains the SSPC state through the event.

OFF circuit 104 includes a resistive elements 112 and 113 configured to receive an OFF signal from the SSPC controller 101 and an inverting amplifier circuit that uses a small signal FET 114. In other aspects, FET 114 may be another type of semiconductor device. Resistive elements 112 and 113 are configured to provide a voltage division that only turns FET 114 ON if the SSPC drive state OFF is a full logic 1 signal. Resistor 113 also provides a path for leakage currents when the 'OFF' signal is floating and not driven due to the SEL. OFF circuit 104 and ON circuit 102 are connected together in parallel via a resistive element 118 and holding capacitor 116.

Both ON circuit 102 and OFF circuit 104 can include series resistors (e.g., resistive elements 110 and 118) configured such that they prevent a momentary glitch from an ON state to an OFF state or OFF state to ON state during a processor reset following an SEL. Holding capacitor 116, along with resistors 110 and 118, can result in a holding time constant that ensures that this does not happen and that the output if OFF stays OFF and if ON stays ON all through the SEL recovery process. Accordingly the output only 'floats' if the SSPC was OFF and stays OFF which is a normal case for the SSPC being OFF. In some aspects, time constant is between the holding capacitor and the effective leakage path to ground which includes some reverse leakage current through the diode 120, the leakage current through the OFF FET 114, and leakage current through the Zener diode 122, as well as a small amount of leakage through the cap itself and through the main FET gate.

According to one or more embodiments, the time constant between the resistive elements 110 and 118, and holding capacitor 116 is configured to be long enough to ride through a reset period such that the condition will not affect the state of the SSPC during the recovery from the SEL by turning the SSPC drive state from OFF to ON, or by turning the SSPC drive state from ON to OFF. For example, similar to ON circuit 102, when the SSPC drive state signal is OFF and an SEL occurs, system 100 does not send logic 1 signals to either the ON driver or the OFF driver, and the power switching device 105 'floats' on stored voltage of approximately 0 volts stored in holding capacitor 116.

, OFF circuit 104 is configured to require a logic 1 (i.e., a voltage high signal) so that when the SSPC drive state droops OFF circuit 104 is not activated (e.g., forced high). Accordingly, ON circuit 102 output and the OFF circuit 104 output are now defined so that each must be driven by a logic 1 (e.g., voltage high) for either circuit to function. Similarly when the SSPC is ON, and an SEL occurs, again there are no logic 1 signals sent to either the ON circuit 102 (which was previously driven to ON) nor to the OFF circuit 104. The SSPC FET gate 126 then "floats" on the stored charge from the holding capacitor 116 and thus keeps the SSPC channel (e.g., feed 128) turned ON while the control logic is being reset.

Figure 2:
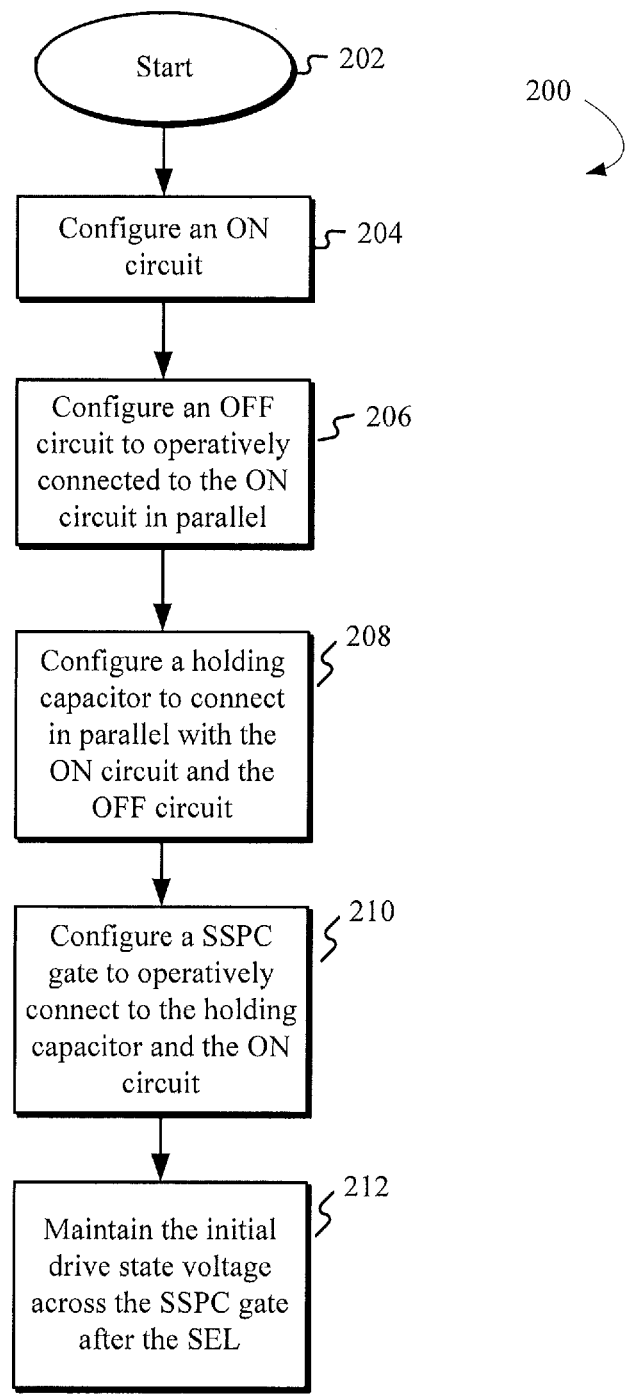
FIG. 2 depicts a flow diagram of a method for mitigating SEL latchup with a sample and hold circuit, according to one or more embodiments.

FIG. 2 is a flow diagram of a method 200 for mitigating SEL latchup with a sample and hold circuit, according to one or more embodiments. Referring now to FIG. 2, after an initial starting step 202, at block 204 the method includes configuring an ON circuit 102.

At block 206, the method includes configuring an OFF circuit 104 to be operatively connected to the ON circuit 104.

At block 208, the method further includes configuring a holding capacitor 116 to connect in parallel with the ON circuit 102 and the OFF circuit 104. The method also includes receiving, from an SSPC controller 101, via the ON circuit 102 or the OFF circuit 104, an SSPC drive state voltage (not shown); and storing, in the holding capacitor 116, the SSPC drive state voltage.

As shown in block 210, the method further includes configuring a power switching device 105 to operatively connect to the holding capacitor 116 and the ON circuit 102.

At block 212, the method concludes with maintaining the initial drive state voltage to the power switching device 105 after the SEL event. For example, system 100 may supply, at the power switching device 105, the drive state voltage via a leakage current for a predetermined time period during which the SSPC controller 101 resets.

Embodiments of the present invention may mitigate an SSPC open or closed fault condition. With this invention included in the SSPC circuitry, an SEL can occur and the SSPC control logic can be power cycled without the output changing state. This can allow a load to receive uninterrupted power throughout the period of time at which the system recovers from the SEL. Embodiments of the present invention may also avoid nuisance 'No Fault Found' returns in the SSPC controller that would have occurred if the load had gone off during operation. Embodiments of the present invention may also ensure that a load that is already off at the onset of a SEL (e.g., in a low power state) will stay off through the SEL recovery process.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system for mitigating a solid state power controller (SSPC) erroneous state caused by single event latchup (SEL) comprising:
    an ON circuit;
    an OFF circuit operatively connected in parallel to the ON circuit;
    a holding capacitor operatively connected in parallel with the ON circuit and the OFF circuit and that connects an output of the ON circuit to ground, and
    a power switching device operatively connected to the holding capacitor and the ON circuit;
    wherein, responsive to the SEL the system is configured to maintain, during and after the SEL, a drive state voltage to the power switching device that is stored in the holding capacitor prior to the SEL.

2. The system of claim 1, wherein the ON circuit, the OFF circuit, the holding capacitor, and the SSPC gate are configured to:
    receive, from an SSPC controller, via the ON circuit or the OFF circuit, an SSPC drive state voltage; and store, in the holding capacitor, the SSPC drive state voltage.

3. The system of claim 1, wherein the ON circuit, the OFF circuit, the holding capacitor, and the power switching device are further configured to supply, at the power switching device, the drive state voltage via a leakage current for a predetermined time period during which the SSPC is power cycled to clear the SEL.

4. The system of claim 1, wherein the SSPC is in an OFF state and the drive state voltage to the power switching device is low.

5. The system of claim 1, wherein the SSPC is in an ON state and the drive state voltage to the power switching device is high.

6. The system of claim 1, wherein the ON circuit comprises:
    an amplifier configured to receive the drive state voltage;
    a diode operatively connected in series with the amplifier; and
    a first resistive element operatively connected in series with the diode and the holding capacitor and configured to transmit the drive state voltage to the holding capacitor and the power switching device.

7. The system of claim 6, wherein the amplifier, the diode and the first resistive element are configured with a time constant sufficient to supply, at the power switching device, the drive state voltage via a leakage current for a predetermined time period during which the SSPC is power cycled to clear the SEL.

8. The system of claim 1, wherein the OFF circuit comprises:
    a second resistive element configured to receive the drive state voltage; and
    a semiconductor device operatively connected to the second resistive element, the ON circuit, and the holding capacitor and configured to transmit the drive state voltage to the holding capacitor.

9. The system of claim 1, wherein the power switching device comprises:
    a plurality of diodes operatively connected in parallel to a second FET.

10. A method for mitigating a solid state power controller (SSPC) open or closed momentary state change caused by single event latchup (SEL) comprising:
    configuring an ON circuit;
    configuring an OFF circuit operatively connected in parallel to the ON circuit;
    configuring a holding capacitor operatively connected in parallel with the ON circuit and the OFF circuit and that connects an output of the ON circuit to ground;
    configuring a power switching device operatively connected to the holding capacitor and the ON circuit; and
    maintaining, during and after the SEL, a drive state voltage to the power switching device that is stored in the holding capacitor prior to the SEL.

11. The method of claim 10, further comprising:
    receiving, from an SSPC controller, via the ON circuit or the OFF circuit, an SSPC drive state voltage; and
    storing, in the holding capacitor, the SSPC drive state voltage.

12. The method of claim 10, further comprising supplying, at the power switching device, the drive state voltage via a leakage current for a predetermined time period during which the SSPC is power cycled.

13. The method of claim 10, wherein the SSPC is in an OFF state and the drive state voltage to the power switching device is low.

14. The method of claim 10, wherein the SSPC is in an ON state and the drive state voltage to the power switching device is high.

15. The method of claim 10, further comprising:
    receiving the drive state voltage at an amplifier; and
    transmitting the drive state voltage to the holding capacitor and the power switching device via a first resistive element operatively connected in series with a diode and the holding capacitor.

16. The method of claim 10 further comprising:
    receiving, at a second resistive element in the OFF circuit, the drive state voltage;
    transmitting the drive state voltage to a semiconductor device operatively connected to the second resistive element, the ON circuit, and the holding capacitor; and
    transmitting the drive state voltage to the holding capacitor.

* * * * *